United States Patent [19]
Sano et al.

[11] Patent Number: 5,174,854
[45] Date of Patent: Dec. 29, 1992

[54] CRYSTAL GROWTH OF GROUP II-VI COMPOUND SEMICONDUCTOR

[75] Inventors: Michihiro Sano, Odawara; Yasuo Okuno, Yokohama, both of Japan

[73] Assignee: Stanley Electric Co., Ltd., Tokyo, Japan

[21] Appl. No.: 697,076

[22] Filed: May 8, 1991

[30] Foreign Application Priority Data

May 15, 1990 [JP] Japan .................................. 2-124479

[51] Int. Cl.⁵ .............................................. C30B 7/00
[52] U.S. Cl. ........................... 156/621; 148/DIG. 64; 156/603; 156/622; 156/624; 156/DIG. 72; 156/DIG. 73; 156/DIG. 77; 437/102
[58] Field of Search ............... 156/603, 621, 622, 624, 156/DIG. 72, DIG. 73, DIG. 77; 148/DIG. 64; 437/102

[56] References Cited

U.S. PATENT DOCUMENTS

| | | |
|---|---|---|
| 4,465,527 | 8/1984 | Nishizawa .......................... 437/119 |
| 4,526,632 | 7/1985 | Nishizawa et al. .................. 437/127 |
| 4,572,763 | 2/1986 | Nishizawa .......................... 422/248 |
| 4,685,979 | 8/1987 | Nishizawa .......................... 437/81 |
| 4,909,998 | 3/1990 | Nishizawa .......................... 422/248 |

Primary Examiner—Olik Chaudhuri
Assistant Examiner—Felisa Garrett
Attorney, Agent, or Firm—Frishauf, Holtz, Goodman & Woodward

[57] ABSTRACT

A ZnSe source crystal is treated in a Se vapor pressure peaks are obtained when the Se pressure is 6 to 9 atoms dissolved in a Zn solvent to the saturation concentration at a high temperature portion in the solution. A ZnSe single crystal is grown on an underlie substrate placed at a low temperature portion in the solution. When the temperature of the vapor pressure treatment is 1050° C., excellent photoluminescence peaks are obtained when the Se pressure is 6 to 9 atoms.

17 Claims, 4 Drawing Sheets

PRIOR WORK

CRYSTAL GROWTH OF GROUP II-VI COMPOUND SEMICONDUCTOR

BACKGROUND OF THE INVENTION

1. Field of the Invention

This invention relates to crystal growth of compound semiconductors, and more particularly to crystal growth of group II-VI compound semiconductors utilizing zinc as a solvent.

Group II-VI compound semiconductors such as ZnS and ZnSe have utility in light emitting devices, such as blue light emitting diodes.

2. Description of the Related Art

The present inventors have been developing crystal growth of group II-VI compound semiconductors.

FIG. 2 illustrates an example of a liquid phase crystal growth apparatus for growing a compound semiconductor crystal, according to the inventors' prior work.

A heat sink 11 of good thermal conduction, for example formed of a quartz solid rod, is secured at the bottom of a crystal growth vessel 10 formed of a quartz tube of an appropriate inner diameter, such as 8 to 12 mm$\phi$. A substrate crystal 12, which is a growth underlie, is disposed on the heat sink 11 and pressed thereon by a substrate positioner 13. The substrate positioner 13 is formed of quartz or carbon and shaped in a cylinder of an appropriate length. Zinc (Zn) solvent 14, which is first in powder form of granular shape, is contained in the vessel 10. A source crystal 15, such as a ZnSe polycrystalline disk, is disposed on the substrate positioner 13. A weight 16 formed of a solid rod, of e.g. quartz, for securing the source crystal 15 is placed on the source crystal. The vessel 10 of the crystal growth apparatus of such construction is evacuated to a vacuum of $1 \times 10^{-6}$ Torr or less and sealed.

The crystal growth apparatus as described above is disposed in a temperature gradient as shown at the righthand part of FIG. 2, to dissolve the source crystal 15 located at a higher temperature portion into the solvent 14 to the saturation concentration, to let the dissolved solute be transported by diffusion, and to cause epitaxial crystal growth on the substrate 12 located at a lower temperature portion.

When a group II-VI compound semiconductor crystal, for example ZnSe, is grown by the above-mentioned growth method, the composition of the ZnSe crystal grown on the substrate becomes Zn-rich due to the use of Zn solvent, which is the group II constituent element of the grown crystal, to cause a deviation from the stoichiometric composition.

SUMMARY OF THE INVENTION

An object of this invention is to provide a method for growing a group II-VI compound semiconductor, using Zn as a solvent and being capable of properly controlling the composition of the grown crystal.

According to an aspect of this invention, there is provided a method of growing a group II-VI compound semiconductor, comprising the steps of thermally treating a source crystal of a group II-VI compound semiconductor under a vapor pressure of a group VI constituent element of the group II-VI compound semiconductor to be grown, and growing a crystal of the group II-VI compound semiconductor from liquid phase at a growth temperature, using a solvent mainly composed of Zn and the source crystal subjected to said thermal treatment step.

The source crystal is preliminarily thermally treated under vapor pressure of a group VI constituent element of the group II-VI compound semiconductor before the liquid phase growth, to control the composition of the source crystal itself to be group VI element rich. Then, crystal growth is done on a substrate disposed in the Zn solution using the thermally treated source crystal, to control the deviation that would otherwise occur from the stoichiometric composition of the grown crystal.

Figure 1A:
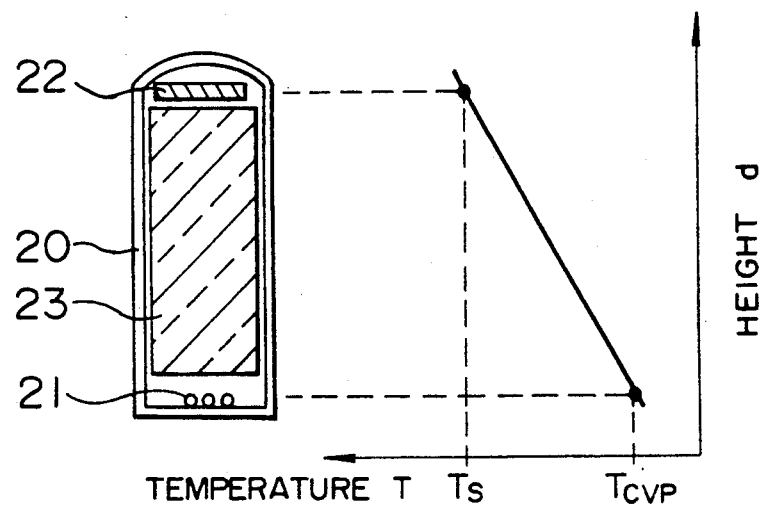
FIGS. 1A and 1B are cross sections and temperature distribution diagrams of the crystal growth apparatus for achieving group II-VI compound semiconductor crystal growth according to an embodiment of this invention.

In the drawings, reference numerals denote the followings: 10, 20, 30 quartz vessel; 11, 31 heat sink; 12, 32 substrate crystal; 13, 33 substrate positioner; 14, 34 solvent; 15, 22, 35 source crystal; 16, 36 weight; 21 composition controlling material; and 23 quartz rod spacer.

DESCRIPTION OF THE PREFERRED EMBODIMENTS

Figure 1B:
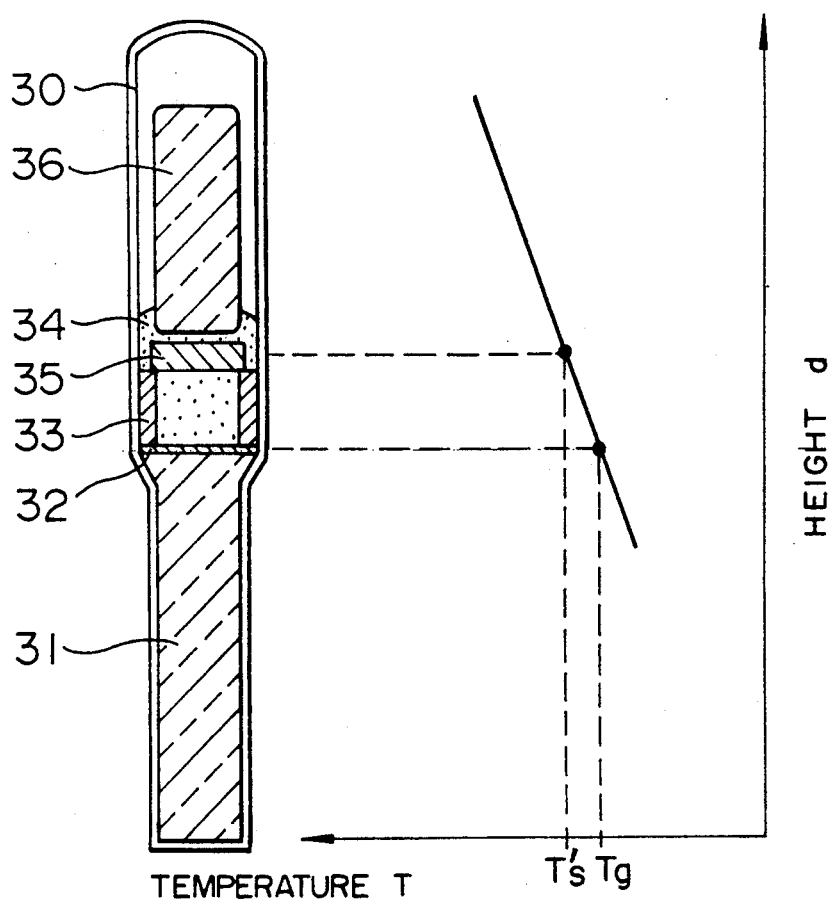
Figure 2:
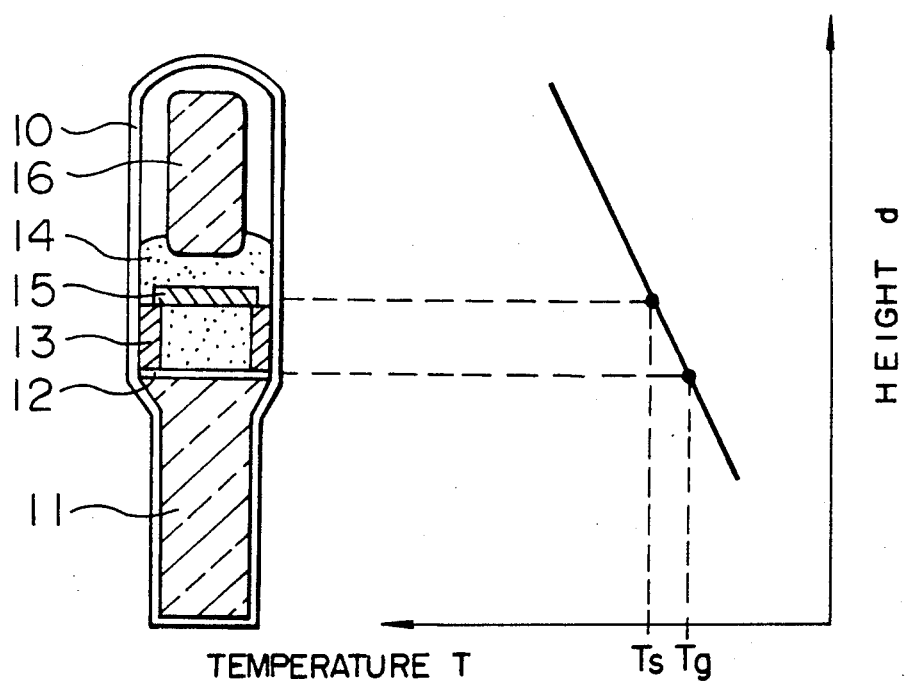
FIG. 2 is a cross section and temperature distribution diagram of a liquid phase crystal growth apparatus for illustrating a liquid phase crystal growth of a group II-VI compound semiconductor according to prior work.

FIGS. 1A and 1B show an apparatus for growing group II-VI compound semiconductors for carrying out an embodiment of this invention. Description will be made hereinbelow taking ZnSe as a typical example of the group II-VI compound semiconductors to be grown using a solvent mainly composed of Zn.

This embodiment includes a first step of thermal vapor pressure treatment for controlling the composition of the source crystal as shown in FIG. 1A, and a second step of liquid phase crystal growth as shown in FIG. 1B.

FIG. 1A shows a structure of the thermal vapor pressure treatment device to be used in the first step. At the bottom of a quartz tube 20 having an appropriate inner diameter such as 8 to 12 mm$\phi$ and having its inner surface subjected to thorough rinsing and etching, Se material 21 which is the group VI constituent element of the crystal to be grown is disposed as a composition controlling material. The Se material 21 which is the composition controlling material has been thoroughly rinsed and etched. A quartz solid rod spacer 23 having a smaller diameter than the inner diameter of the quartz tube 20 and having been preliminarily rinsed is disposed above the Se material 21 at the bottom portion by some supporting member such as a projection from the inner wall of the tube 20. At an upper portion of the quartz tube 20, a source crystal 22 to be subjected to a thermal treatment is disposed on the quartz rod spacer 23. This source crystal 22 is formed of a ZnSe polycrystalline block or plate or disk synthesized at a temperature lower than the growth temperature of the liquid phase crystal growth of the second step. There is formed a small gap between the quartz rod spacer 23 and the inner wall of the tube 20 to communicate the lower space for containing the composition controlling Se material 21 and the upper space for containing the source crystal 22 through a certain distance with a passage of a small cross section. Then, the inside of the quartz tube 20 of the above construction is evacuated to a high vacuum such as $10^{-6}$ Torr or less and sealed.

Next, this quartz tube is placed in an electric furnace having a temperature gradient as shown at the righthand part of FIG. 1A. The temperature becomes higher as the vertical position becomes higher. In the temperature distribution, Ts denotes the temperature of a high temperature portion where the source crystal 22 is disposed, and Tcvp denotes a temperature of a low temperature portion where the composition controlling Se material 21 is disposed. For example, when a Se pressure of 8 atm is selected, Tcvp is set at about 880° C. Here, the quantity of the composition controlling Se material 21 is selected at a value larger than the saturation molar quantity in the tube at the temperature of Tcvp. By this thermal treatment, a Se saturation vapor pressure at the temperature Tcvp is applied to the source crystal 22 at the temperature Ts to vary the chemical composition of the source crystal ZnSe. Here, it is preferable to select the temperature Ts of the source crystal at a temperature higher than the liquid phase crystal growth temperature Tg, and to keep the temperatures at the respective portions at constant values in the thermal treatment process. Further, the time period for the thermal vapor pressure treatment is found to have influence on the carrier mobility, and is preferably selected longer than about 90 hours and more preferably not less than about 100 hours. The effect appears to be saturated when the treatment time exceeds 100 hours.

Next, description will be made on the liquid phase crystal growth of the second step. FIG. 1B shows a structure of the liquid phase crystal growth device.

First, a quartz vessel 30 for growing crystal having an appropriate inner diameter (8 to 12 mmφ) is prepared. The quartz vessel 30 is subjected to fluoric acid (HF) etching, rinsing and vacuum baking. At the bottom of the quartz vessel 30, a heat sink 31 formed of a material of a good thermal conduction such a quartz solid rod is contained and secured. A ZnSe substrate single crystal 32, which works as a growth underlie, is placed on the heat sink 31. The substrate crystal 32 preferably has (111) surface, but may also have (100) surface. The substrate crystal 32 is thoroughly rinsed and etched before putting it into the vessel 30. The substrate crystal 32 is contacted on the heat sink 31 and secured thereat by a substrate positioner 33. The substrate positioner 33 is formed of a material such as quartz or carbon, and has a cylindrical shape of an appropriate length, for example 5 to 15 mm. Then, Zn solvent 34 is put into the vessel 30. On the substrate positioner 33, the source crystal 35 which has been subjected to the thermal treatment as described in connection with FIG. 1A is disposed. Then, a weight 36 formed of a quartz solid rod, etc. is placed on the source crystal 35 which has had its composition controlled by the thermal vapor pressure treatment, for securing the source crystal 35. Then, the inside of the vessel 30 of the crystal growth device of the above construction is evacuated to a vacuum of $1 \times 10^{-6}$ Torr or less and sealed.

Then, the vessel 30 as prepared above is placed in a growth furnace having a temperature distribution as shown at the righthand part of FIG. 1B to carry out liquid phase crystal growth by the temperature difference. In the temperature distribution, Ts' denotes a temperature of a higher temperature portion at which the source crystal 35 is disposed, and Tg denotes a temperature of a lower temperature portion at which the substrate crystal 32 is disposed and crystal growth is to be achieved thereon. The temperature gradient is set at 3° to 12° C./cm, for example, at about 7.5° C./cm. For example, Tg≃1025° C. and Ts≃1033° C. The source crystal 35 has been subjected to the thermal vapor pressure treatment of the above-mentioned first step at a temperature Ts higher than the growth temperature Tg (Tg<Ts) under Se vapor pressure, to change its composition to be Se-richer than the stoichiometric composition (II:IV=1:1). In the temperature distribution, the source crystal 35 dissolves into the solvent to the saturation concentration, e.g. at about 1033° C. The dissolved solute is transported by diffusion to lower temperature portions to form a super-saturated state. At the substrate crystal 32, the super-saturated solution causes liquid phase epitaxial growth, e.g. at about 1025° C. The transport of the source material is controlled by the temperature difference between the source crystal and the substrate, Ts'−Tg. Here, because the composition of the solute ZnSe in the solvent Zn 34 is controlled and Tg<Ts, the chemical composition of the grown crystal can be stably controlled.

Figure 3:
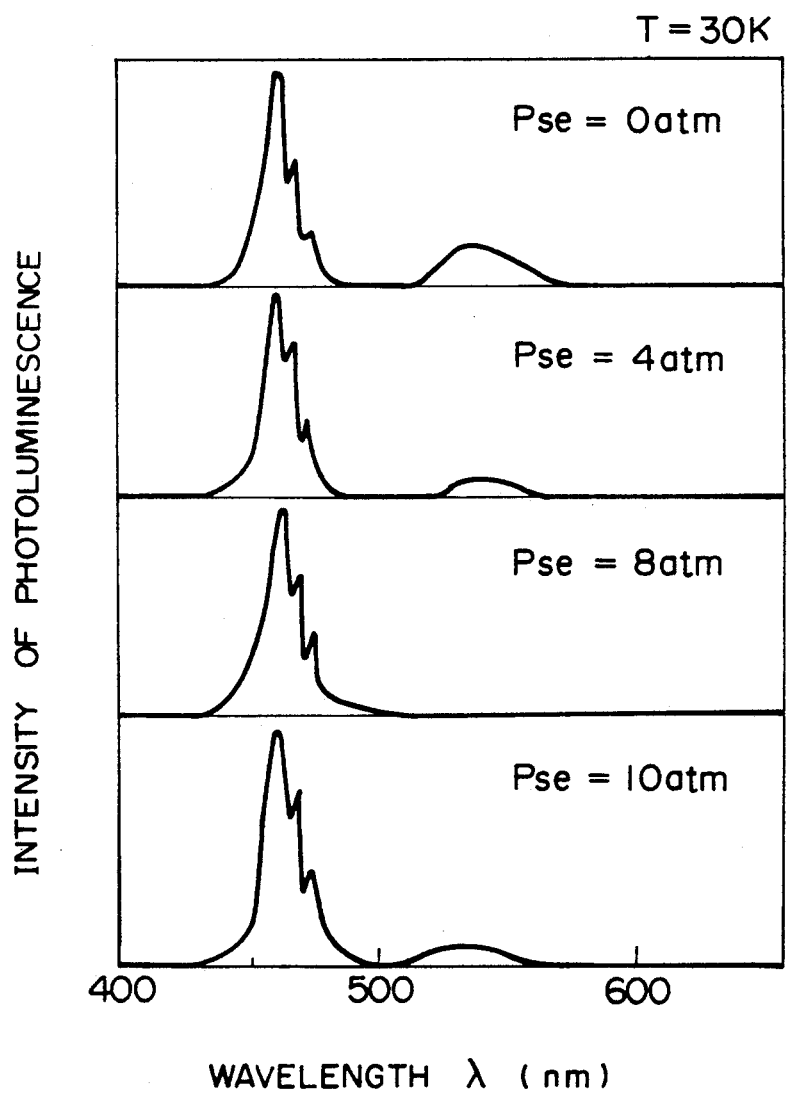
FIG. 3 depicts graphs showing optical properties of ZnSe crystals grown by liquid phase crystal growth after Se vapor pressure treatment of the source crystal at various Se pressures.
Figure 4:
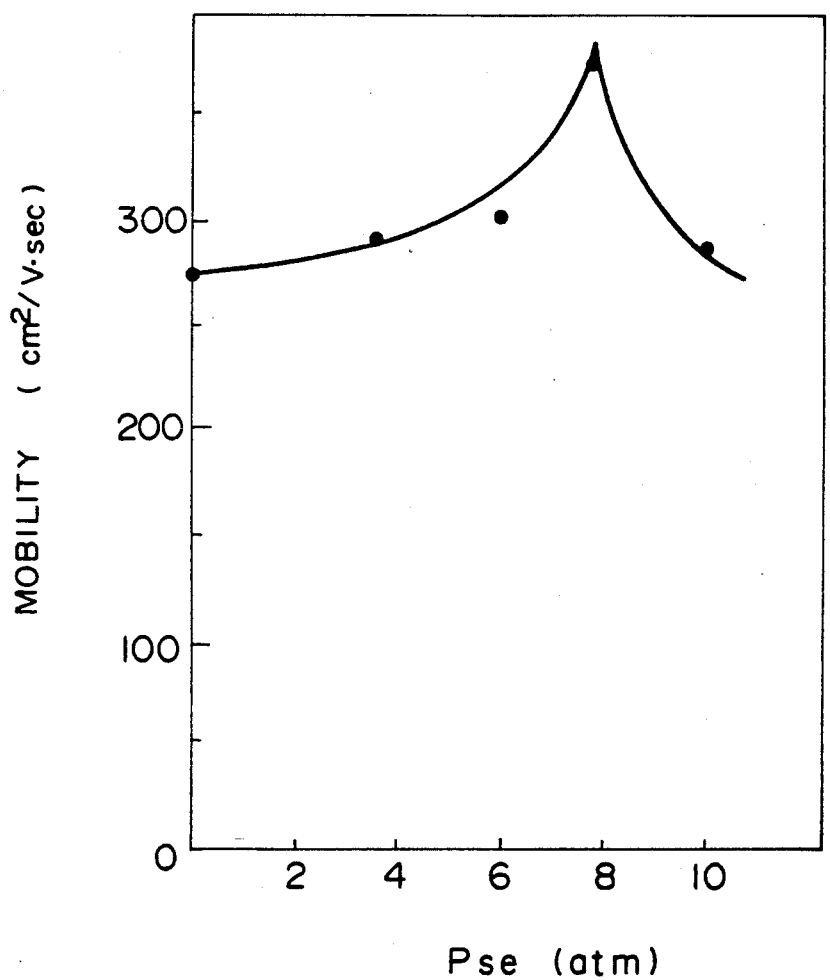
FIG. 4 is a graph showing electrical property of ZnSe crystals grown by the liquid phase crystal growth after Se vapor pressure treatment of the source crystal at various Se pressures.

Next, for confirming the effect of the above mentioned crystal growth method, the optical properties and the electrical properties of the grown ZnSe crystals were measured. FIG. 3 and 4 show the experimental results. The sample crystals were grown at 1025° C. from Zn solution under various conditions of the thermal vapor pressure treatment of the first step. The thermal treatment temperature of Ts=1050° C. and the treatment period of 100 hours in the thermal vapor pressure treatment for the source crystal were kept constant, and the vapor pressure of the composition controlling Se material Pse was changed as a running parameter to make four kinds of crystals treated at different Se pressures. Here, Br as a conductivity controlling impurity was doped at a concentration of about $3 \times 10^{-6}$ mol %, to the thermally treated source crystal.

FIG. 3 shows emission spectra of photoluminescence at T=30 K° of the crystals treated grown from source crystals under various Se pressure Pse in the thermal treatment. The observed main peak is a so-called DAP related with recombination of an electron bound by a neutral donor and a hole bound by a neutral acceptor.

As an active material for forming a blue light emitting device, a material having a large emission peak in the blue light region and have no emission peak in other wavelength region is desired. When Pse=0 atm, a wide noise emission peak centering around a wavelength of about 540 nm is observed except a blue light emission having a peak at a wavelength of about 460 nm. When the Se pressure Pse is increased, this noise emission peak decreases, and at Pse=8 atm, there is observed almost no noise emission peak. When the Se pressure Pse is further increased to Pse=10 atm, another noise emission peak at some different wavelength region appears. Therefore, it can be seen that a structure or structures for causing the noise emission is most suppressed when the Se pressure is about 6 to 9 atm and more preferably around about 8 atm.

FIG. 4 shows the dependency of the electron mobility in the grown ZnSe crystals, on the Se pressure Pse in the thermal vapor pressure treatment process. In a crystal of good quality having a good stoichiometric composition, carrier scattering is low and the mobility of the carrier becomes high, compared to the non-stoichiometric composition. The measured mobility shows a peak around Pse=8 atm. Namely, it can be seen that electrically good crystals of low carrier scattering are grown at Se pressures of about 6 to 9 atm and more particularly around about 8 atm. The preferred range of Se pressure coincide with the results of FIG. 3.

From the characteristic curves shown in FIGS. 3 and 4, it is seen that when the Se vapor pressure Pse in the thermal vapor pressure treatment of the source crystal in the first step is selected in a pressure range of 6 to 9 atm, especially around 8 atm, the grown crystals have excellent emission properties and high carrier mobilities. It is considered that the chemical composition of the grown crystal becomes most appropriate when the source crystal is treated as above. For example, when a blue light emitting element is to be manufactured using ZnSe single crystals, it is preferable to treat the source crystal as above and then to grow ZnSe single crystals by the liquid phase crystal growth using Zn solvent.

Here, the most appropriate vapor pressure Pse for the thermal vapor pressure treatment naturally depends on the thermal treatment temperature and the crystal growth temperature. When the thermal vapor pressure treatment temperature and/or the crystal growth temperature is changed, the preferred Se vapor pressure would be changed accordingly. Further, although description has been made on an example of ZnSe as the crystal to be grown, the above method is not limited to the growth of ZnSe. The above method is equally applicable to the crystal growth of all group II-VI compound semiconductors, which have higher vapor pressure for the group VI element than the group II element, using Zn solvent. For example, the above method is applicable to ZnS, ZnSe, CdS, CdSe, etc. which easily generate group VI site vacancies at high temperatures.

As is described above, in a method of growing group II-VI compound semiconductor crystals from liquid phase, using a solvent mainly composed of Zn, deviation from the stoichiometric composition of the grown crystal can be controlled by first subjecting the source crystal to be used for the crystal growth under a vapor pressure of a group VI constituent element of the group II-VI compound semiconductor preliminary to control the composition of the source crystal itself, and then growing a crystal from liquid phase by using the thermally treated source crystal and a solvent mainly composed of Zn.

Although description has been made on various embodiments of this invention hereinabove, the present invention is not limited thereto. For example, it will be apparent for those skilled in the art that various substitutions, alterations, improvements, and combinations are possible within the scope and spirit of the appended claims.

We claim:

1. A method of growing a group II-VI compound semiconductor, comprising the steps of:
    forming an enriched source crystal that is enriched with the group VI constituent element by thermally treating a source crystal of the group II-VI compound semiconductor by heating said source crystal to a thermal treatment temperature and applying to said source crystal a vapor of a group VI constituent element of the group II-VI compound semiconductor; and
    dissolving said thermally treated and enriched source crystal in a solvent consisting essentially of Zn to produce a liquid phase, and growing a substrate crystal of the group II-VI compound semiconductor from said liquid phase at a liquid phase crystal growth temperature.

2. A method of growing a group II-VI compound semiconductor according to claim 1 wherein said thermal treatment step is performed by placing in a closed vessel the source crystal at a portion of the closed vessel at the thermal treatment temperature and the group VI constituent element at a portion of the closed vessel at a temperature lower than the thermal treatment temperature.

3. A method of growing a group II-VI compound semiconductor according to claim 1, wherein said substrate crystal is grown by placing the substrate crystal on a heat sink having a lower temperature than the liquid phase growth temperature and placing the source crystal 5 to 15 cm above the substrate crystal in a solvent consisting essentially of Zn, said solvent in contact with said source crystal being at a higher temperature than the liquid phase crystal growth temperature.

4. A method of growing a group II-VI compound semiconductor according to claim 1, wherein said thermal treatment temperature is higher than the crystal growth temperature.

5. A method of growing a group II-VI compound semiconductor according to claim 1, wherein said thermal treatment is performed for at least 90 hours.

6. A method of growing a group II-VI compound semiconductor according to claim 1, wherein said thermal treatment step is performed for at least 100 hours.

7. A method of growing a group II-VI compound semiconductor according to claim 1, wherein said group II-VI compound semiconductor consists essentially of ZnSe and said group VI constituent element of the group II-VI compound semiconductor whose vapor is applied is Se.

8. A method of growing a group II-VI compound semiconductor according to claim 7, wherein said Se vapor is applied at a pressure between 6 and 9 atmospheres.

9. A method of growing a group II-VI compound semiconductor according to claim 7, wherein said substrate crystal is on a (111) or (100) surface of a ZnSe substrate.

10. A method of growing a group II-VI compound semiconductor according to claim 7, wherein said ZnSe substrate crystal is positioned on a heat sink.

11. A method of growing a group II-VI compound semiconductor, comprising the steps of:
    forming an enriched source crystal that is enriched with said group VI constituent element by thermally treating a source crystal of the group II-VI compound semiconductor by placing in a closed vessel the source crystal at a portion of the closed vessel at a thermal treatment temperature and a group VI constituent element of the group II-VI compound semiconductor at a portion of the closed vessel at a temperature lower than the thermal treatment temperature to apply to said source crystal a vapor of the group VI constituent element;

dissolving said thermally treated and enriched source crystal in a solvent comprising Zn to produce a liquid phase, and growing a substrate crystal of the group II-VI compound semiconductor from said liquid phase by placing the source crystal in the solvent comprising Zn and placing the substrate crystal 5 to 15 cm below the source crystal on a heat sink having a lower temperature than a liquid phase crystal growth temperature, said solvent in contact with said source crystal being at a higher temperature than said liquid phase crystal growth temperature.

12. A method of growing a group II-VI compound semiconductor according to claim 11, wherein said group II-VI compound semiconductor consists essentially of ZnSe and said group VI constituent element of the group II-VI compound semiconductor whose vapor is applied is Se.

13. A method of growing a group II-VI compound semiconductor according to claim 12, wherein said thermal treatment is performed for about 100 hours and wherein said Se vapor pressure is applied at a pressure between 6 and 9 atmospheres.

14. A method of growing a group II-VI compound semiconductor according to claim 12, wherein said substrate crystal is a (111) or (100) ZnSe substrate.

15. A method of growing a group II-VI compound semiconductor according to claim 13, wherein said substrate crystal is on a (111) surface of the ZnSe substrate.

16. A method of growing a group II-VI compound semiconductor according to claim 13, wherein said thermal treating temperature is 1050° C. and said liquid phase crystal growth temperature is 1025° C.

17. A method of growing a group II-VI compound semiconductor according to claim 15, wherein said thermal treating temperature is 1050° C. and said liquid phase crystal growth temperature is 1025° C.

* * * * *